(12) United States Patent
Grant et al.

(10) Patent No.: US 8,399,181 B2
(45) Date of Patent: Mar. 19, 2013

(54) METHODS OF FABRICATING PHOTOMASKS FOR IMPROVING DAMASCENE WIRE UNIFORMITY WITHOUT REDUCING PERFORMANCE

(75) Inventors: Casey J. Grant, Hinesburg, VT (US); Jude L. Hankey, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/346,776

(22) Filed: Jan. 10, 2012

(65) Prior Publication Data

US 2012/0110524 A1 May 3, 2012

Related U.S. Application Data

(62) Division of application No. 12/622,461, filed on Nov. 20, 2009, now Pat. No. 8,129,095.

(60) Provisional application No. 61/167,591, filed on Apr. 8, 2009.

(51) Int. Cl.
| | |
|---|---|
| G03F 7/16 | (2006.01) |
| G03F 7/20 | (2006.01) |
| G03F 7/40 | (2006.01) |
| G06F 17/50 | (2006.01) |

(52) U.S. Cl. ............................ 430/313; 430/314; 716/55
(58) Field of Classification Search .................... 716/55; 430/313–314
See application file for complete search history.

(56) References Cited

U.S. PATENT DOCUMENTS

| | | |
|---|---|---|
| 6,281,049 B1 | 8/2001 | Lee |
| 6,489,247 B1 | 12/2002 | Ye et al. |
| 6,563,148 B2 | 5/2003 | Kawashima et al. |
| 6,751,785 B1 | 6/2004 | Oh |
| 6,849,549 B1 | 2/2005 | Chiou et al. |
| 6,904,581 B1 | 6/2005 | Oh |
| 6,969,687 B2 | 11/2005 | Levi et al. |
| 7,174,520 B2 | 2/2007 | White et al. |
| 7,235,424 B2 | 6/2007 | Chen et al. |
| 7,243,316 B2 | 7/2007 | White et al. |
| 7,353,475 B2 | 4/2008 | White et al. |
| 7,360,179 B2 | 4/2008 | Smith et al. |

(Continued)

OTHER PUBLICATIONS

Lee, Brian et al.; Using Smart Dummy Fill and Selective Reverse Etchback for Pattern Density Equalization; Proceedings of CMP-MIC, Santa Clara, CA, Mar. 2000; pp. 255-258.

(Continued)

*Primary Examiner* — Mark F Huff
*Assistant Examiner* — John S Ruggles
(74) *Attorney, Agent, or Firm* — Schmeiser, Olsen & Watts; Richard Kotulak

(57) ABSTRACT

A method of improving damascene wire uniformity without reducing performance. The method includes simultaneously forming a multiplicity of damascene wires and a multiplicity of metal dummy shapes in a dielectric layer of a wiring level of an integrated circuit chip, the metal dummy shapes being dispersed between damascene wires of the multiplicity of damascene wires; and removing or modifying those metal dummy shapes of the multiplicity of metal dummy shapes within exclusion regions around selected damascene wires of the multiplicity of damascene wires. Also a method of fabricating a photomask and a photomask for use in improving damascene wire uniformity without reducing performance.

18 Claims, 10 Drawing Sheets

U.S. PATENT DOCUMENTS

| | | |
|---|---|---|
| 7,367,008 B2 | 4/2008 | White et al. |
| 7,380,220 B2 | 5/2008 | Smith et al. |
| 7,383,521 B2 | 6/2008 | Smith et al. |
| 2002/0025689 A1 | 2/2002 | Yang et al. |
| 2003/0204832 A1* | 10/2003 | Matumoto ............... 716/54 |
| 2003/0229479 A1 | 12/2003 | Smith et al. |
| 2006/0056219 A1 | 3/2006 | Araki et al. |
| 2006/0105564 A1 | 5/2006 | Taravade et al. |
| 2007/0015365 A1 | 1/2007 | Chen et al. |
| 2007/0101305 A1 | 5/2007 | Smith et al. |
| 2007/0256039 A1 | 11/2007 | White |

OTHER PUBLICATIONS

Office Action (Mail Date Jun. 21, 2011) for U.S. Appl. No. 12/622,461, filed Nov. 20, 2009.
Amended dated Sep. 19, 2011 in response to Office Action (Mail Date Jun. 21, 2011) for U.S. Appl. No. 12/622,461, filed Nov. 20, 2009.
Notice of Allowance (Mail Date Oct. 28, 2011) for U.S. Appl. No. 12/622,461, filed Nov. 20, 2009.

* cited by examiner

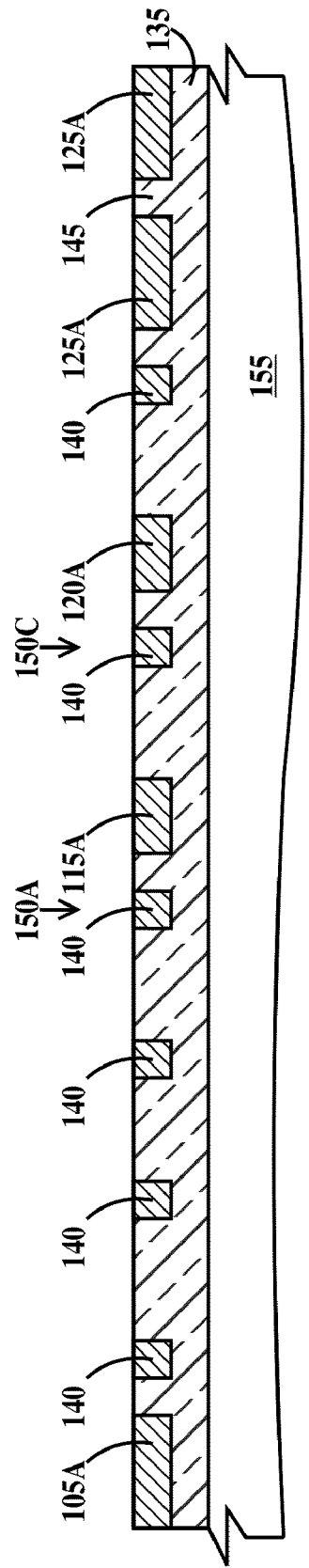
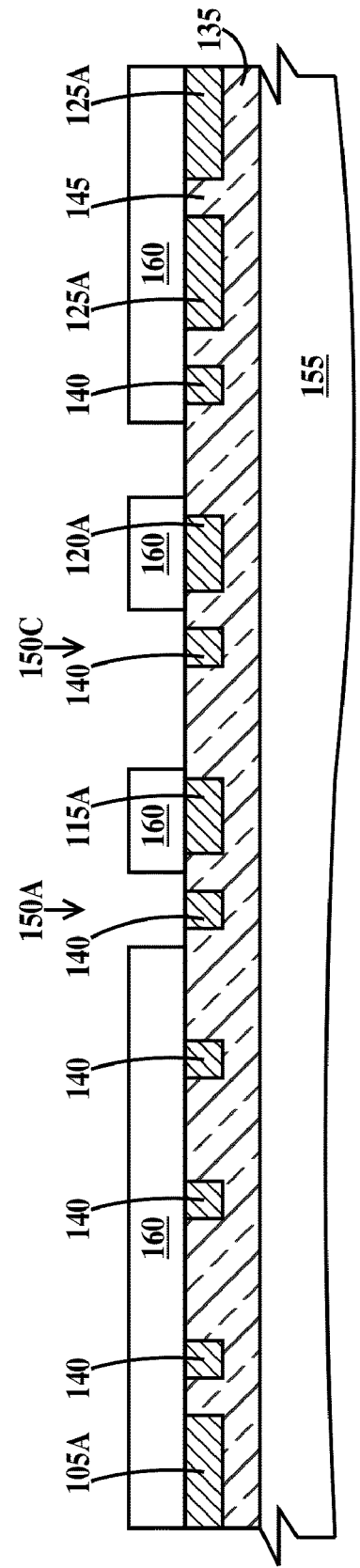

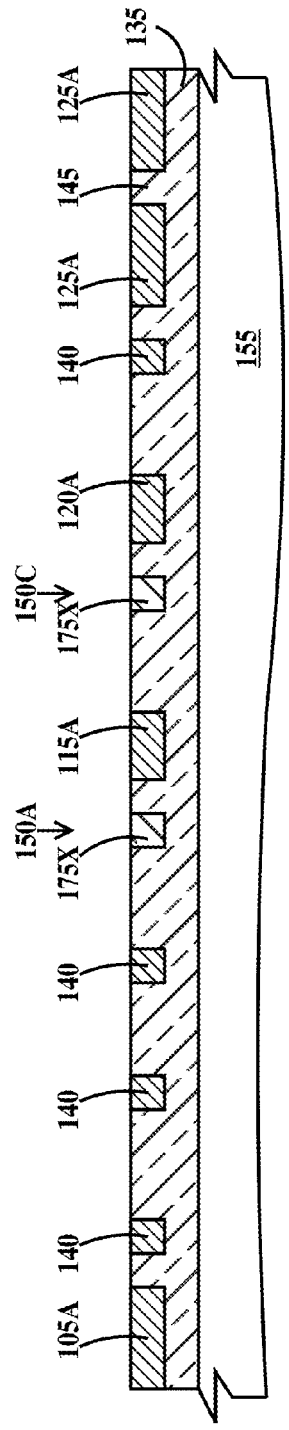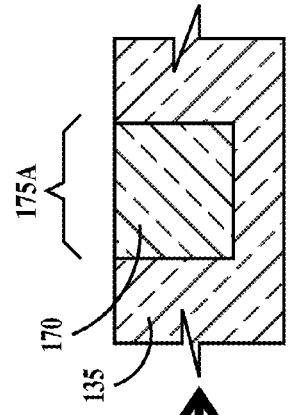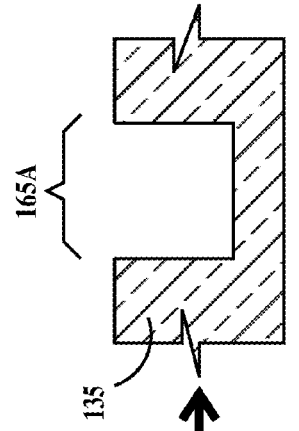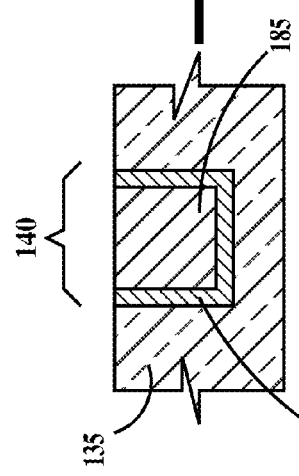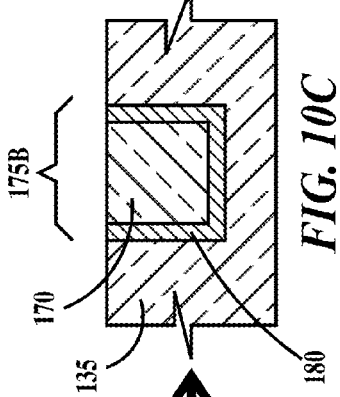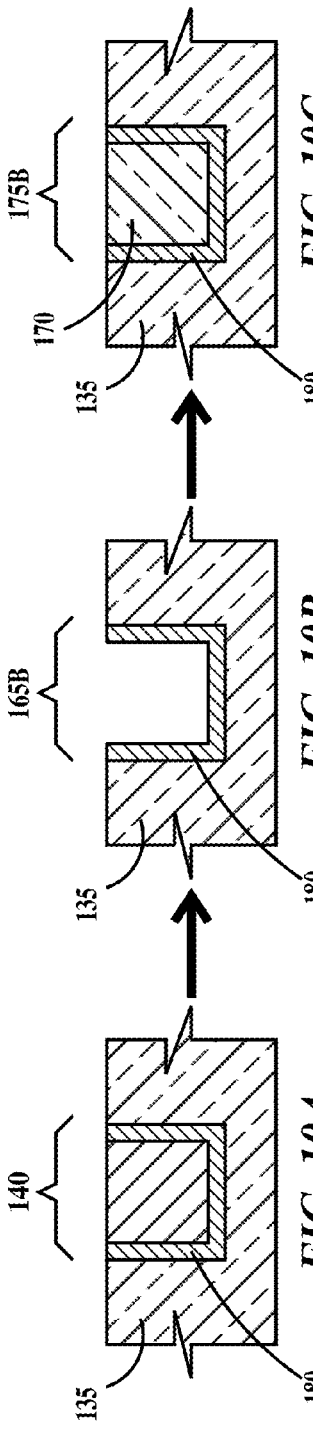

METHODS OF FABRICATING PHOTOMASKS FOR IMPROVING DAMASCENE WIRE UNIFORMITY WITHOUT REDUCING PERFORMANCE

The present Application is a division of U.S. patent application Ser. No. 12/622,461 filed on Nov. 20, 2009, now U.S. Pat. No. 8,129,095 issued Mar. 6, 2012, which further claims domestic priority to provisional U.S. application 61/167,591 filed on Apr. 8, 2009.

FIELD OF THE INVENTION

The present invention relates to methods for forming damascene metal wires for integrated circuit chips and more specifically, it relates methods for increasing wire uniformity while avoiding parasitic proximity effects that reduce integrated circuit chip performance.

BACKGROUND OF THE INVENTION

The chemical mechanical polishing process used in the manufacture of damascene wires in order requires uniform pattern density to avoid degradation in damascene wire performance due to wire non-uniformity. However, the very techniques such as adding fill shapes to wiring layers, while improving pattern density can themselves adversely affect the damascene wire performance. Accordingly, there exists a need in the art to eliminate or mitigate the deficiencies and limitations described hereinabove.

SUMMARY OF THE INVENTION

A first aspect of the present invention is a method, comprising: simultaneously forming a multiplicity of damascene wires and a multiplicity metal dummy shapes in a dielectric layer of a wiring level of an integrated circuit chip, the metal dummy shapes dispersed between damascene wires of the multiplicity of damascene wires; and removing or modifying those metal dummy shapes of the multiplicity of metal dummy shapes within exclusion regions around selected damascene wires of the multiplicity of damascene wires.

A second aspect of the present invention is a method, including: (a) generating a design of a wiring level of an integrated circuit chip, the design including data describing wires of the wiring level and data describing exclusion regions around wires of the wiring level; after (a), (b) generating a wiring level shapes file including wire shapes from the data describing the wires of the wiring level; (c) generating a metal dummy shape removal/modification shapes file including metal dummy shape removal/modification shapes from the data describing the wires of the wiring level and the data describing the exclusion regions; after (b), (d) adding metal fill shapes to the wiring level shapes between one or more of the wire shapes; and after (b) and (d), (e) generating a first photomask data set from the wiring level shapes file and a second photomask data set from the metal dummy shape removal/modification shapes file.

A third aspect of the present invention is a reticle for use in a fabricating a wiring level of an integrated circuit chip, comprising: a first cell including mask shapes defining damascene wires and metal dummy shapes for a first photolithographic fabrication step of the wiring level; and a second cell including mask shapes defining a subset of the metal dummy shapes to be removed or modified for a second photolithographic fabrication step of the wiring level.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 3 is a cross-section through line 3-3 of FIG. 2;

FIG. 5 is a cross-section through line 5-5 of FIG. 4;

FIGS. 6, 7 and 8 are is cross-sections through line 5-5 of FIG. 4 illustrating additional process steps according to embodiments of the present invention;

FIGS. 9A, 9B and 9C are detailed views of the steps illustrated in FIGS. 6, 7 and 8 according to a first alternative processing scheme of the present invention;

FIGS. 10A, 10B and 10C are detailed views of the steps illustrated in FIGS. 6, 7 and 8 according to a second alternative processing scheme of the present invention;

DETAILED DESCRIPTION OF THE INVENTION

A damascene process is one in which wire trenches or via openings are formed in a dielectric layer, an electrical conductor of sufficient thickness to fill the trenches is deposited in the trenches and on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

Fill shapes exist in shapes files of wiring levels of a circuit design and become photomask shapes on photomasks generated from the circuit design. Fill shapes result in dummy shapes on actual integrated circuit chips. Dummy shapes may exist as dielectric islands (i.e., dielectric dummy shapes) embedded in single-damascene or dual-damascene wires or as single-damascene or dual-damascene metal islands (i.e., metal dummy shapes) between single-damascene or dual-damascene wires and vias in a wiring level of an integrated circuit chip. Metal dummy shapes are defined as shapes not electrically connected to any wire or via contained in the same wiring level as the metal dummy shapes or to any other metal wire or via in other wiring levels.

The embodiments of the present invention will be described and illustrated in a single wiring level using single-damascene technology. It should be understood that the invention may be practiced on multiple wiring levels of an integrated circuit chip and may be practiced using dual-damascene technology or a combination of single-damascene and dual-damascene technology. Hereinafter, the term damascene (without the qualifiers "single" or "dual" should be understood to mean single-damascene or dual-damascene.

Figure 1:
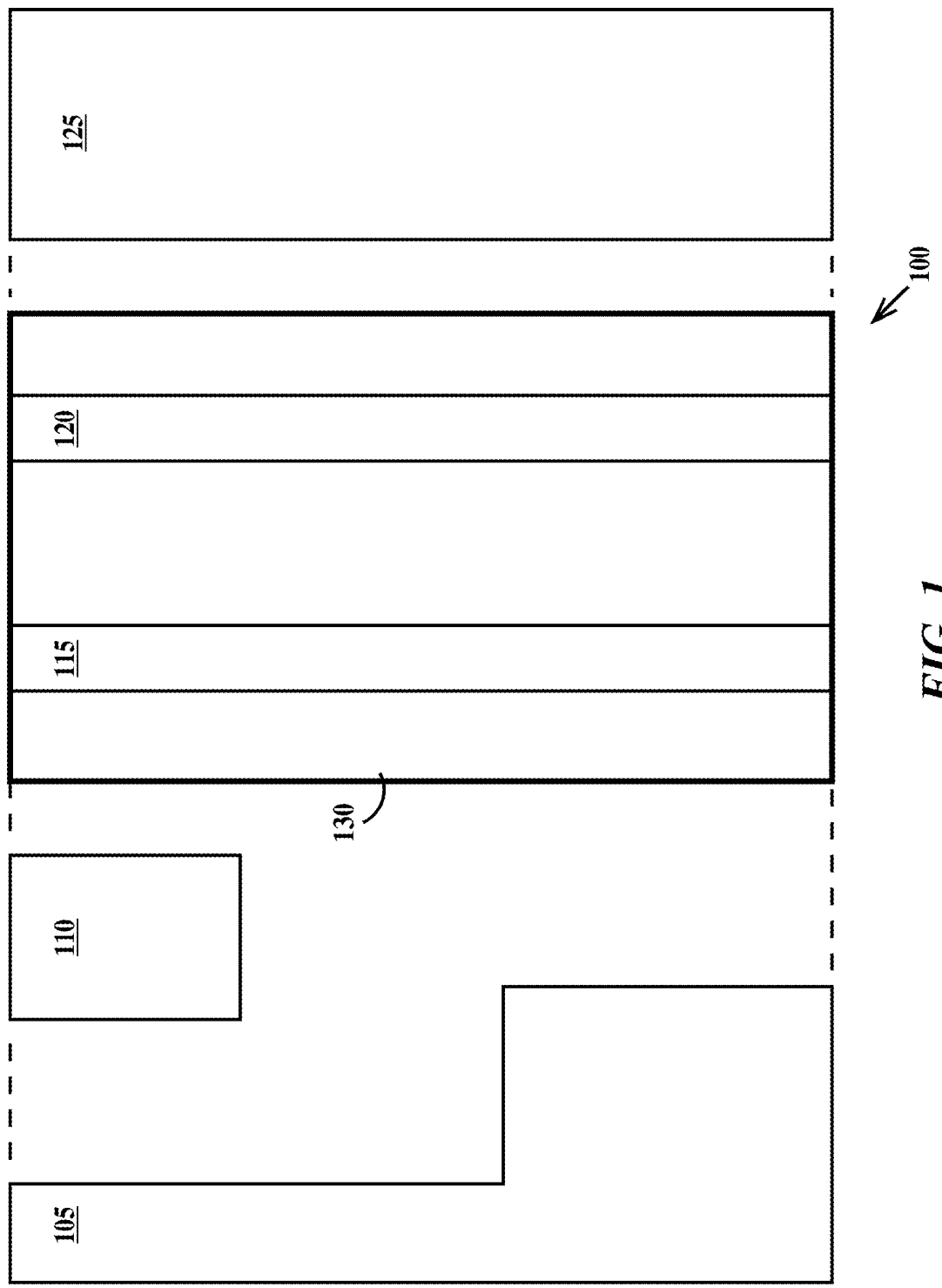
FIG. 1 is top view of a region of wire level of an integrated circuit chip design according to embodiments of the present invention.

FIG. 1 is top view of a region of wire level of an integrated circuit chip design according to embodiments of the present invention. In FIG. 1, a portion of an interconnect level design 100 of an integrated circuit chip includes wire shapes 105, 110, 115, 120 and 125. Wire shapes 115 and 120 correspond, after fabrication, to damascene wires whose performance may be adversely affected by the presence of metal dummy shapes within an exclusion region 130 (i.e., the region within heavy lines).

Figure 2:
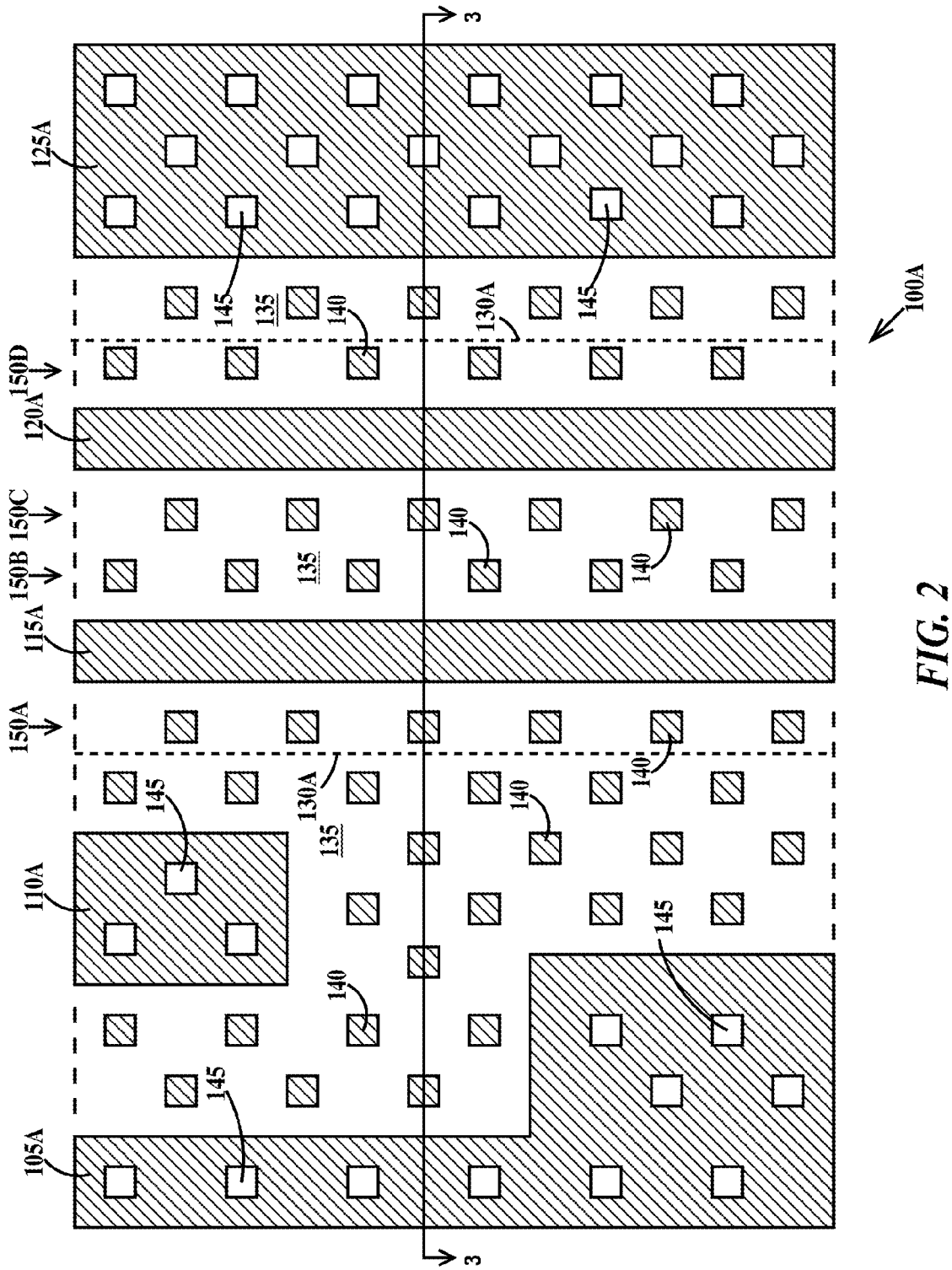
FIG. 2 is top view of the region of a wire level of an actual integrated circuit chip corresponding to the region of FIG. 1 after initial processing steps according to embodiments of the present invention.

FIG. 2 is top view of the region of a wire level of an actual integrated circuit chip corresponding to the region of FIG. 1 after initial processing steps according to embodiments of the present invention. In FIG. 2, region 100A corresponds to region 100 of FIG. 1. Damascene wires 105A, 110A, 115A, 120A and 125A correspond respectfully to wire shapes 105, 110, 115, 120 and 125 of FIG. 1. Wires 105A, 110A, 115A, 120A and 125A are formed in a dielectric layer 135. Also formed in dielectric layer 135 are metal dummy shapes 140. Wires 105A, 110A and 125A include dielectric dummy shapes 145. Dummy shapes 140 and 145 have the effect of providing uniform local (e.g., within region 100A) and global (e.g., the integrated circuit chip or a core) metal pattern density for the CMP process. Without uniform metal pattern density, because of hardness differences between metal and dielectric materials, some wires may dish (the surface becomes concave), so the wire is thinner than designed slowing down signal transmission. Columns 150A, 150B, 150C, and 150D of dummy shapes 140 are of particular interest because they are within exclusion region 130 (small dash line). In one example, wires 105A, 110A, 115A, 120A and 125A and dummy shapes 140 includes an optional electrically conductive liner and a core conductor. In one example, the liner may comprise layers of titanium and/or titanium nitride or layers of tantalum and/or tantalum nitride. Titanium, titanium nitride, tantalum and tantalum nitride may be deposited by sputtering. In one example, the core conductor may comprise copper or tungsten. Copper may be deposited electrochemically (i.e., by plating). Tungsten may be deposited by chemical vapor deposition or sputtering.

FIG. 3 is a cross-section through line 3-3 of FIG. 2. In FIG. 3, dielectric layer 135 is formed on a semiconductor substrate 155. Substrate 155 may include devices such as transistors and other wiring levels similar to the wiring level containing dielectric layer 135, wires 105A, 110A, 115A, 120A and 125A and dummy shapes 140.

Figure 4:
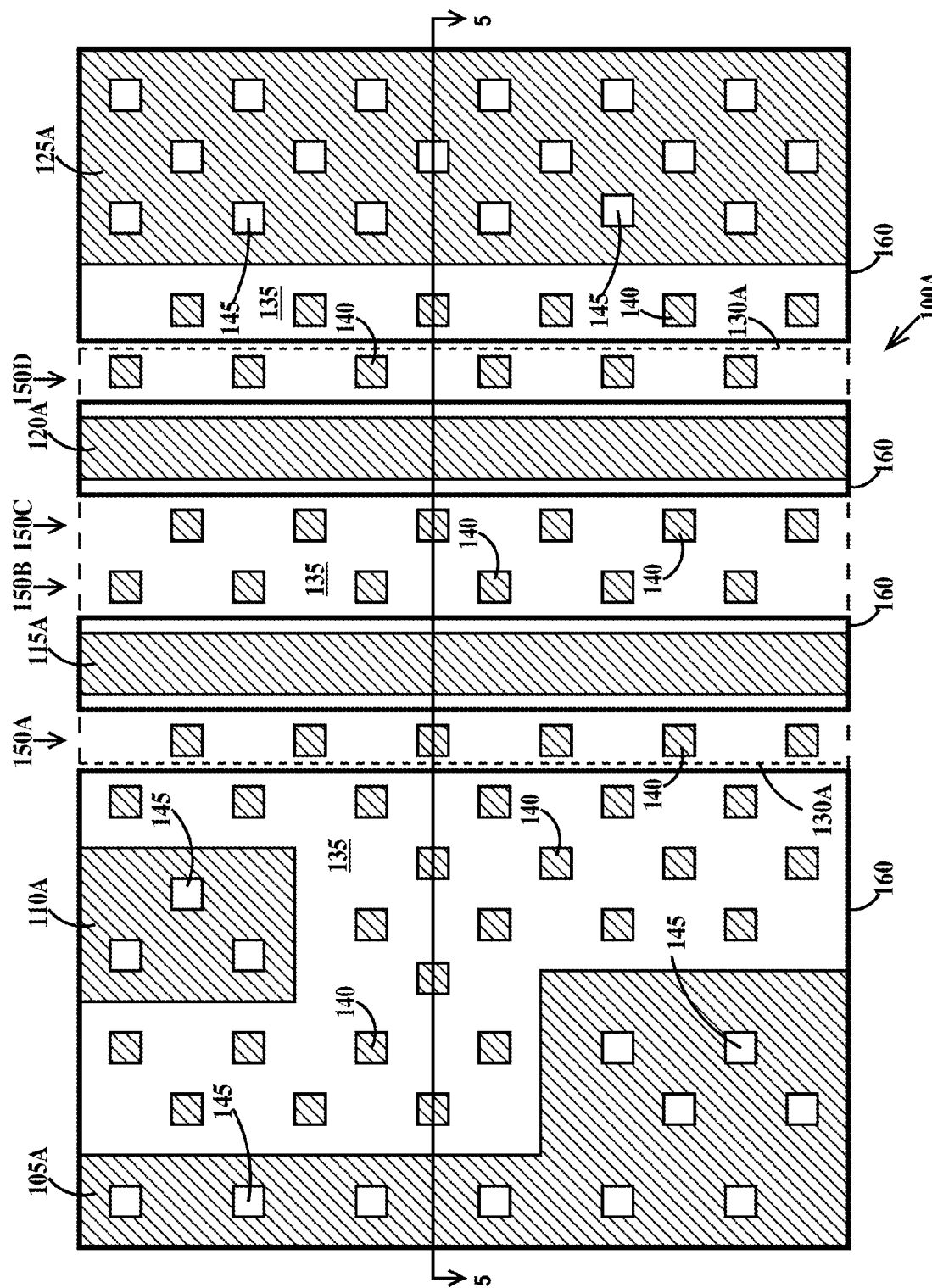
FIG. 4 is top view of a region of a wire level of an actual integrated circuit chip corresponding to the region of FIG. 1 after a metal dummy shape removal photolithography step according to embodiments of the present invention.

FIG. 4 is top view of a region of a wire level of an actual integrated circuit chip corresponding to the region of FIG. 1 after a metal dummy shape removal photolithography step according to embodiments of the present invention. In FIG. 4, the photolithography step, but not the actual dummy shape removal has been performed.

A photolithographic process is one in which a photoresist layer is applied to a surface, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After further processing (e.g., an etch or an ion implantation), the patterned photoresist is removed. The photoresist layer may optionally be baked at one or more of the following steps: prior to exposure to actinic radiation, between exposure to actinic radiation and development, after development.

Returning to FIG. 4, photoresist islands 160 (heavy lines) are formed on wires 105A, 110A, 115A, 120A, and 125A and all dummy shapes 140 but not on dummy shapes in columns 150A, 150B, 150C and 150D which are within exclusion region 130.

Figure 4A:
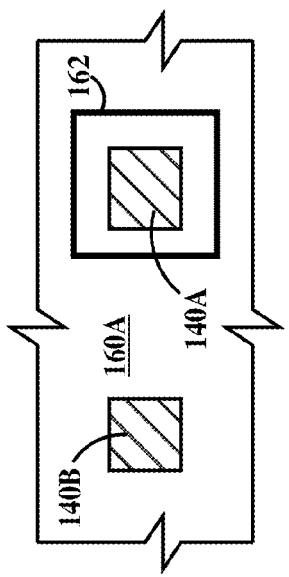
FIG. 4A illustrates an alternative photoresist pattern to that of FIG. 4.

FIG. 4A illustrates an alternative photoresist pattern to that of FIG. 4. In FIG. 4A, a patterned photoresist layer 160A includes openings 162 over dummy shapes 140A that are to be removed or modified, but not over dummy shapes 140B that are to be left in place.

FIG. 5 is a cross-section through line 5-5 of FIG. 4. In FIG. 5, photoresist islands 160 protect wires 105A, 110A, 115A, 120A, and 125A and all dummy shapes 140 except which are within region 130.

Figure 6:
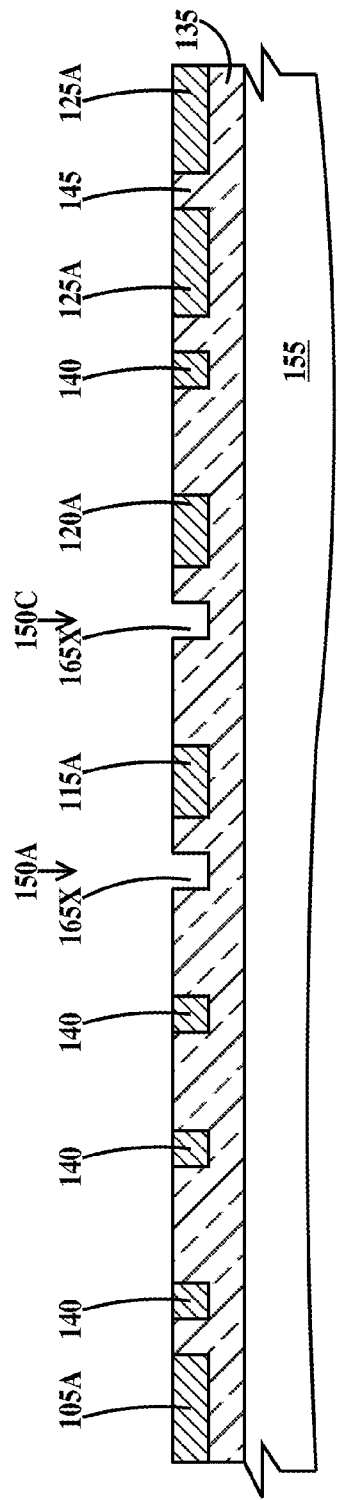
Figure 7:
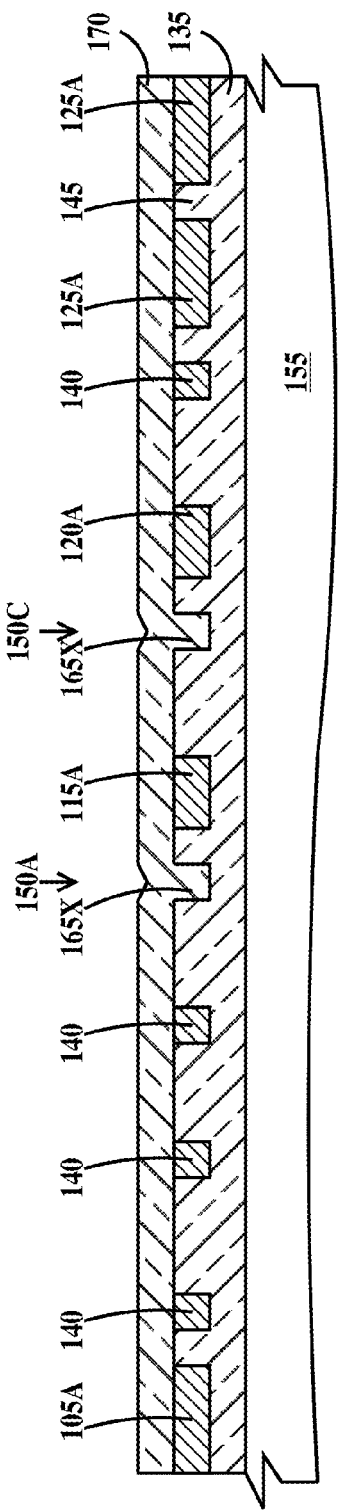

FIGS. 6, 7 and 8 are cross-sections through line 5-5 of FIG. 4 illustrating additional process steps according to embodiments of the present invention. In FIG. 6 an etch step is performed to remove all or a portion of dummy shapes 140 (see FIG. 5) in columns 150A, 150B (see FIG. 4), 150C and 150D (see FIG. 4) to form dummy trenches 165X (where X is either A or B, see infra) in dielectric layer 135 and then photoresist islands 160 (see FIG. 5) are removed. The etch step may be either a wet etch or a dry etch (e.g., a reactive ion etch (RIE) or a plasma etch) or combinations of wet and dry etches. When dummy shapes 140 (see FIG. 5) are copper (or have a copper core conductor), a wet etch may be performed using a dilute mixture of HCl and hydrogen peroxide or a RIE using HCl and/or HBr plasma process feed gases may be used. Optionally hydrogen gas may be added to the RIE plasma process feed gas. In one example, dissociation of HCl and/or HBR are the sole source of the reactive copper etching species generated by the plasma. In one example, dissociation of HCl and/or HBR provides at least about 40% of the reactive copper etching species generated by the RIE plasma. In one example, dissociation of HCl and/or HBR provides at least about 50% of the reactive copper etching species generated by the RIE plasma. In one example, dissociation of HCl and/or HBR provides at least about 80% of the reactive copper etching species generated by the RIE plasma.

In FIG. 7, a dielectric layer 170 is deposited completely filling in trenches 165X.

In FIG. 8, a CMP is performed creating plugs 175X (where X is either A or B, see infra) and exposing top surfaces of wires 105A, 110A, 115A, 120A and 125A, dummy shapes 140 (and 145 see FIG. 2) and a top surface of dielectric layer 135. In one example, dielectric layer is a same material as dielectric layer 135. In one example, dielectric layers 135 and 170 comprise silicon dioxide. In one example, dielectric layer 135 and 170 are independently selected from the group consisting of hydrogen silsesquioxane polymer (HSQ), methyl silsesquioxane polymer (MSQ), polyphenylene oligomer, methyl doped silica or $SiO_x(CH_3)_y$, or $SiC_xO_yH_y$, or SiOCH), organosilicate glass (SiCOH), and porous SiCOH, silicon dioxide ($SiO_2$), silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$) or NBLok (SiC(N,H)).

FIGS. 9A. 9B and 9C are detailed views of the steps illustrated in FIGS. 6, 7 and 8 according to a first alternative processing scheme of the present invention. In FIG. 9A, dummy shape 140 includes an optional electrically conductive liner 180 and a core conductor 185. Materials for liner 180 and core conductor 185 are the same as for wires 105A, 110A, 115A, 120A and 120C (see FIG. 2) described supra. In FIG. 9B, both liner 180 and core conductor 185 are removed to form trench 165A. In FIG. 9C, trench 165A (see FIG. 9B) is filled with dielectric 170 to form plug 175A. If, in FIG. 9A, if dummy shape 140 includes no liner 180, only core conductor 185, then the structure illustrated in FIG. 9C still results.

FIGS. 10A. 10B and 10C are detailed views of the steps illustrated in FIGS. 6, 7 and 8 according to a second alternative processing scheme of the present invention. In FIG. 10A, dummy shape 140 includes electrically conductive liner 180 and core conductor 185. In FIG. 10B, only core conductor 185 is removed to form a liner 180 lined trench 165B. In FIG. 10C, trench 165B (see FIG. 10B) is filled with dielectric 170 to form plug 175B where dielectric 170 is separated from dielectric layer 135 by liner 180.

Figure 11:
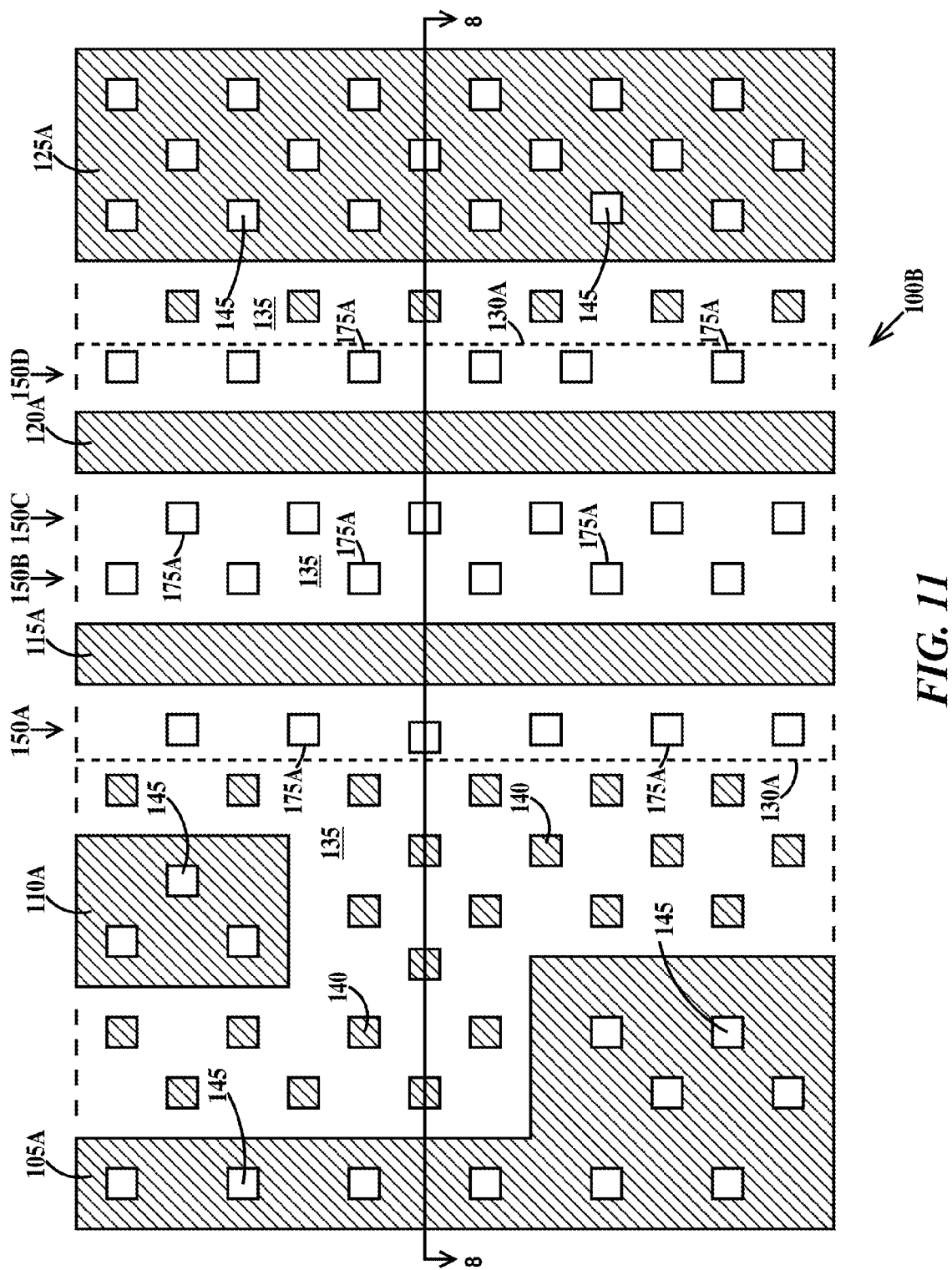
FIG. 11 is a top view of the same region as illustrated in FIG. 2 after processing according to the first alternative processing scheme.

FIG. 11 is a top view of the same region as illustrated in FIG. 2 after processing according to the first alternative processing scheme. FIG. 11 is similar to FIG. 2 except dummy shapes 140 (see FIG. 2) of columns 150A, 150B, 150C, and 150D are replaced with plugs 175A, which consist of dielectric material. Thus there are no metal dummy shapes or portions of metal dummy within exclusion region 130. Because plugs 175A consist of dielectric material, plugs 175A will not interact with signals on wires 115A and 115B as dummy shapes 140 would have.

Figure 12:
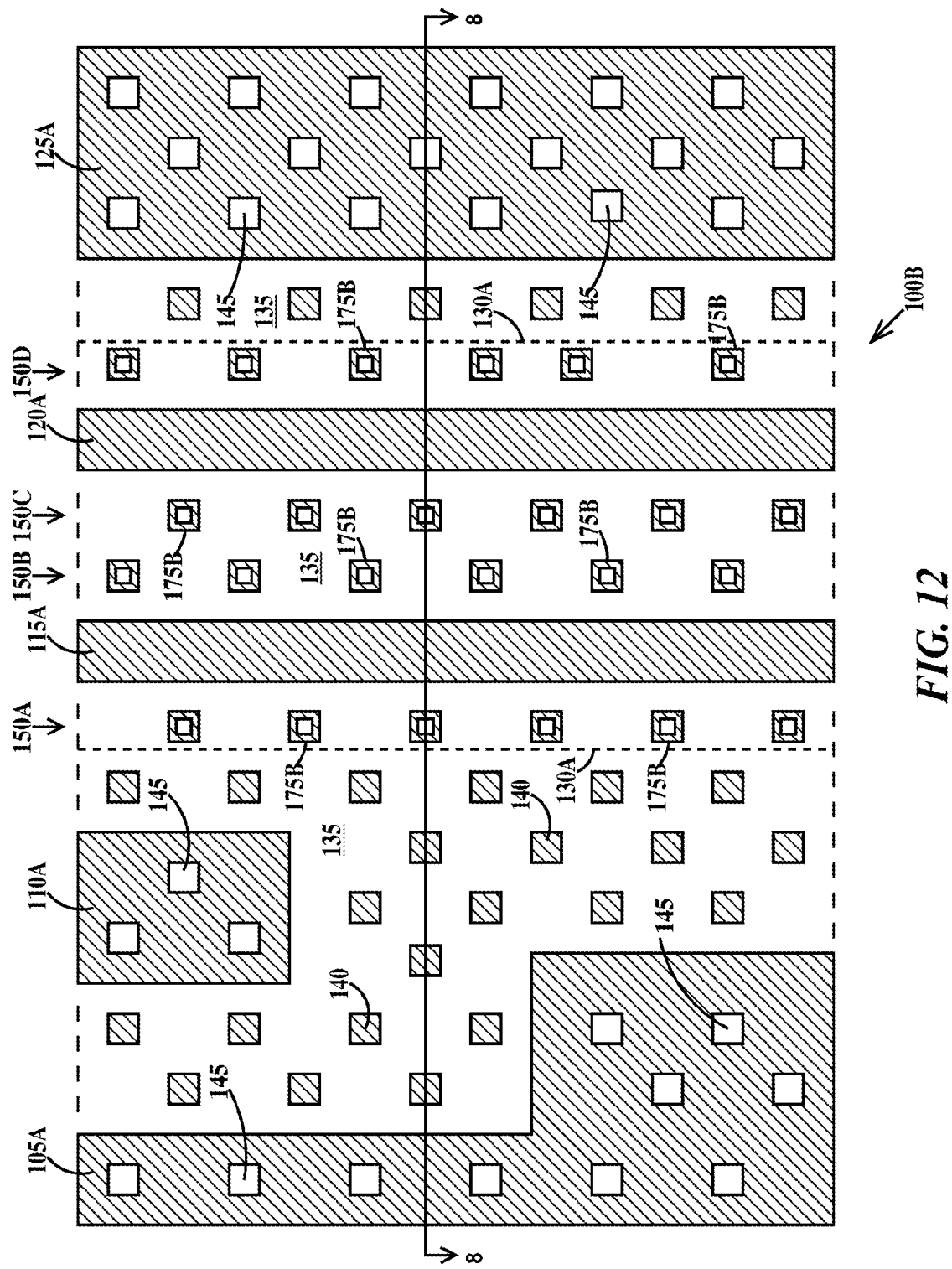
FIG. 12 is a top view of the same region as illustrated in FIG. 2 after processing according to the second alternative processing scheme.

FIG. 12 is a top view of the same region as illustrated in FIG. 2 after processing according to the second alternative processing scheme. FIG. 12 is similar to FIG. 2 except dummy shapes 140 (see FIG. 2) of columns 150A, 150B, 150C, and 150D are replaced with plugs 175B, which consist of dielectric material and the liner of metal shapes. Thus all metal dummy shapes within exclusion region 130 consist of cores of dielectric material surrounded by an electrically conductive liner. Because liners are relatively thin, plugs 175B will interact with signals on wires 115A and 115B to a lesser extent than dummy shapes 140 would have.

Figure 13:
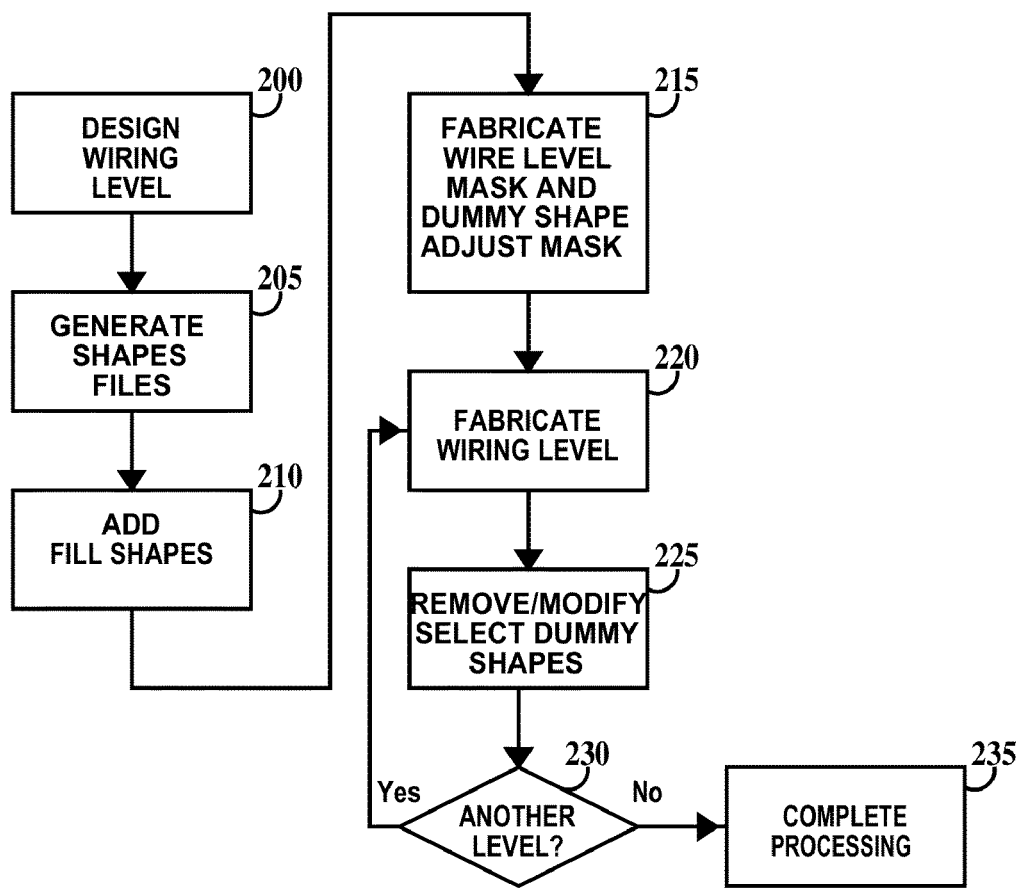
FIG. 13 is a flowchart of the method of the embodiments of the present invention.

FIG. 13 is a flowchart of the method of the embodiments of the present invention. Generally the design of an integrated circuit chip is in the form of a hardware description language (HDL) data file or a netlist (a data file that describes how individual design components are connected together) and essentially describes the wires of the wiring levels. Generally, in conventional design practice for integrated circuit chips, netlists are generated from HDL files and shapes files are generated from netlists.

In step 200, wiring levels of an integrated circuit chip are designed. The HDL data file or the netlist file include exclusion region data describing exclusion regions where metal dummy shapes are to be removed or modified in physical wiring levels of the integrated circuit chip and wire data describing the actual wires in the integrated circuit chip.

In step 205, wire shapes files and metal dummy shape removal/modification shapes files are generated. When the HDL/netlist files are used to generate wire shapes the wire data is used and the exclusion region data are ignored. When the HDL/netlist files are used to generate metal dummy shape removal/modification shapes both the exclusion region data and wire data are used. The metal dummy shape removal/modification shape files are tagged to corresponding wire shapes file.

In step. 210, fill shapes are added to the wiring level shape files. The fill shapes may include metal fill shapes placed between wire shapes and dielectric fill shapes placed within wire shapes. In an exemplary methodology, a fill shape tool places metal fill shapes into the wire level shapes file. The fill shape tool is forbidden to place metal fill shapes that overlap the boundaries of the exclusion regions. Thus the fill shapes are placed completely within and completely without the exclusion region as other fill shape tool rules determine and metal fill shapes so placed do not overlap the boundaries of the exclusion region.

In step 215, wire level photomask data sets and dummy shape removal/modification photomask data sets are generated using, respectively, the wire shapes files and the dummy shape removal/modification shapes files. These photomask data sets are used to generate actual photomasks for each wiring level. For each wiring level, the photomasks may include a first mask having wire shapes and metal and/or dielectric fill shapes and second mask having metal dummy shape removal/modification shapes or a single mask having a first cell having wire shapes and metal and/or dielectric fill shapes and second cell having metal dummy shape removal/modification shapes.

In step 220, a wiring level of the integrated circuit chip is fabricated including all wires and metal dummy shapes using a photomask or photomask cell having wire shapes and metal dummy shapes.

In step 225, if a metal dummy shape removal/modification mask or cell exists for the wiring level, some of the metal dummy shapes are removed or modified using the metal dummy shape removal/modification mask or the metal dummy shape removal/modification cell.

In step 230, if other wiring levels remain to be fabricated, steps 220 and 225 are repeated; otherwise in step 235, the integrated circuit chip is completed.

Figure 14:
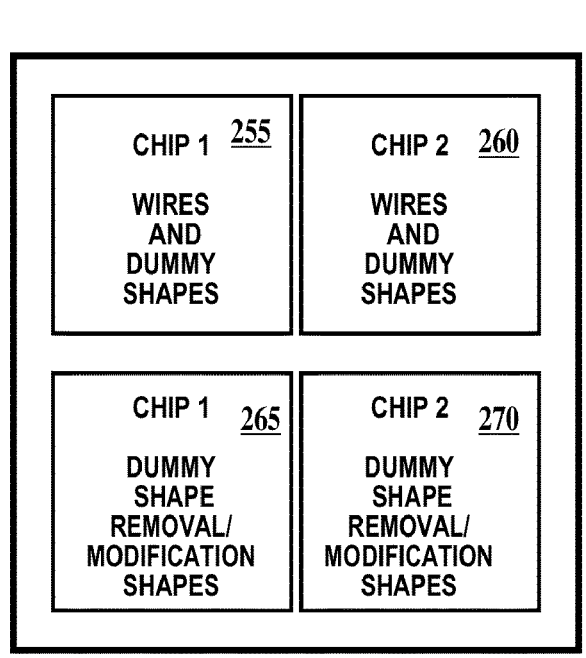
FIG. 14 is a plan view of a multi-layer multi-chip reticle that may be used in practicing the embodiments of present invention.

FIG. 14 is a plan view of a multi-layer multi-chip reticle that may be used in practicing the embodiments of present invention. In FIG. 14, a reticle 250 includes four cells 255, 260, 265 and 270. Cells 255 and 260 are used to define wires and dummy shapes of two integrated circuit chips at the same time in a first photolithographic process. Cells 265 and 270 are used to define where dummy shapes will be removed or modified of two integrated circuit chips at the same time in a second and separate photolithographic process. This saves the resources required to fabricate two separate photomasks.

Generally, the method described herein with respect to designing photomasks for removal or modification of dummy shapes is practiced with a general-purpose computer and the methods described supra in steps 200 through 215 of the flow diagrams of FIG. 13 may be coded as a set of instructions on removable or hard media for use by the general-purpose computer.

Figure 15:
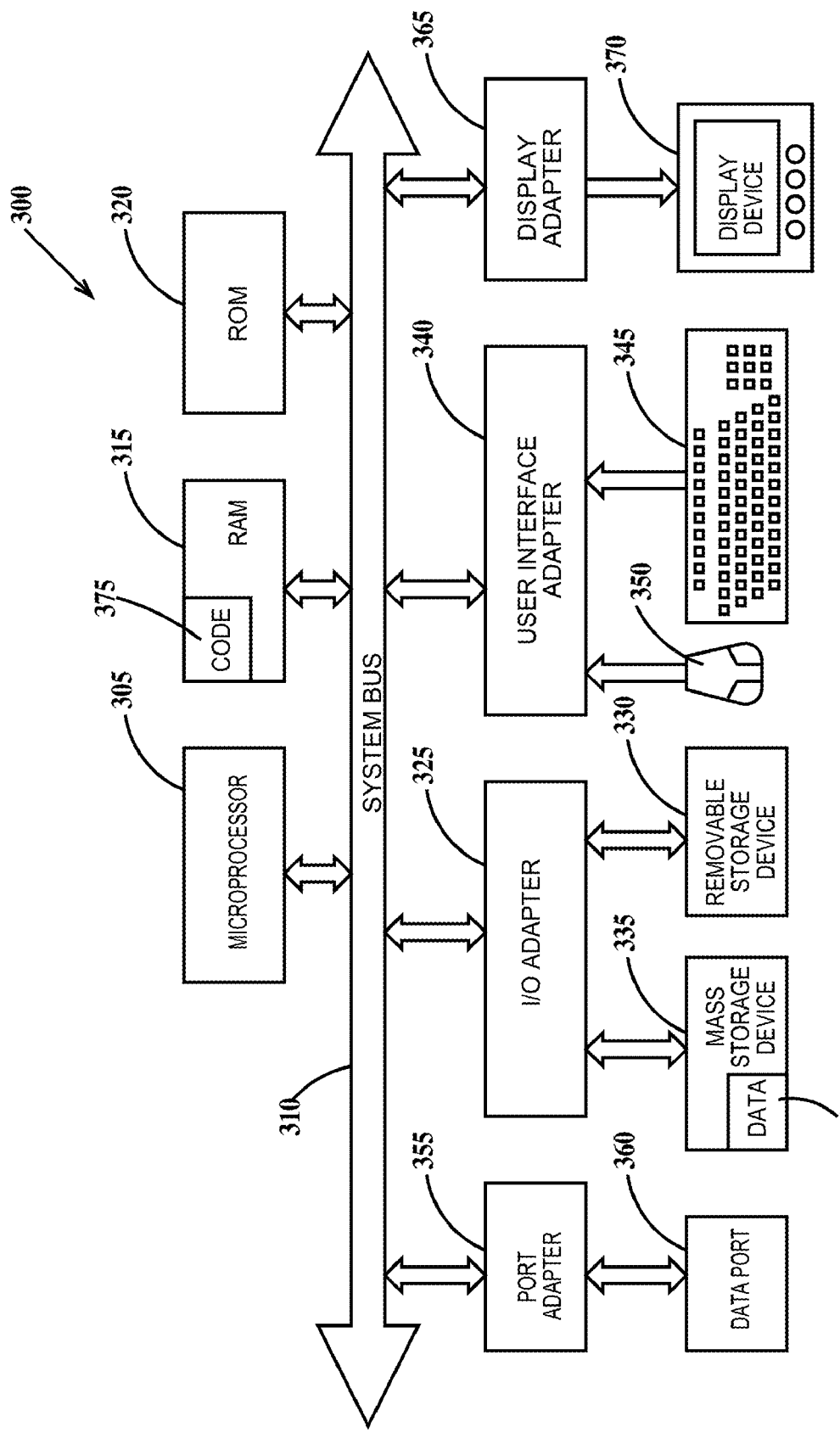
FIG. 15 is a schematic block diagram of a general-purpose computer that may be used in the design of photomasks according to embodiments of the present invention

FIG. 15 is a schematic block diagram of a general-purpose computer that may be used in the design of photomasks according to embodiments of the present invention. In FIG. 15, computer system 300 has at least one microprocessor or central processing unit (CPU) 305. CPU 305 is interconnected via a system bus 310 to a random access memory (RAM) 315, a read-only memory (ROM) 320, an input/output (I/O) adapter 325 for a connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370.

ROM 320 contains the basic operating system for computer system 300. The operating system may alternatively reside in RAM 315 or elsewhere as is known in the art. Examples of removable data and/or program storage device 630 include magnetic media such as floppy drives and tape drives and optical media such as CD ROM drives. Examples of mass data and/or program storage device 335 include electronic, magnetic, optical, electromagnetic, infrared, and semiconductor devices. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 330, fed through data port 360 or typed in using keyboard 345.

Thus the embodiments of the present invention provide methods for using fill shapes to improve damascene wire performance without parasitic degradation or with reduced parasitic degradation of the performance of damascene wires by those same fill shapes. Further embodiments of the present invention provide photomasks and methods of designing photomasks that allow removal or modification of dummy shapes.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, including:
generating a design of a wiring level of an integrated circuit chip, said design including first data describing wires of said wiring level and second data describing exclusion regions around selected wires of said wiring level;
generating a wiring level shapes file including wire shapes from said first data describing the wires of said wiring level;
generating a metal dummy shape removal/modification shapes file including metal dummy shape removal/modification shapes from said first data describing said wires of said wiring level and said second data describing said exclusion regions;
adding metal fill shapes to said wiring level shapes file, said metal fill shapes being placed between two or more of said wire shapes; and
generating a first photomask data set from said wiring level shapes file and a second photomask data set from said metal dummy shape removal/modification shapes file.

2. The method of claim 1, wherein said metal fill shapes define metal dummy shapes of an integrated circuit that are not electrically connected to any wire or via contained in the same wiring level as said metal dummy shapes.

3. The method of claim 1, wherein said metal fill shapes define metal dummy shapes of an integrated circuit that are not electrically connected (i) to any wire or via contained in the same wiring level as said metal dummy shapes or (ii) to any other metal wire in any other wiring level of said integrated circuit.

4. The method of claim 1, wherein said second photomask data set includes shapes that completely overlay all of said metal fill shapes in said exclusion regions and these shapes do not overlay any wire shapes within said exclusion regions or any metal fill shapes or wire shapes outside of said exclusion regions.

5. The method of claim 1, wherein said adding metal fill shapes to said wiring level shapes file is performed by a fill shape tool that is forbidden to place metal fill shapes that overlap boundaries of said exclusion regions.

6. The method of claim 1, wherein said wiring level shapes file is generated from a netlist that describes the wiring level of said integrated circuit.

7. The method of claim 1, wherein said metal dummy shape removal/modification shapes file is generated from a netlist that describes the wiring level of said integrated circuit.

8. The method of claim 1, wherein said metal fill shapes are arranged in a pattern of uniform density.

9. The method of claim 1, wherein said adding metal fill shapes to said wiring level shapes file between two or more of said wire shapes includes placing said metal fill shapes such that said metal fill shapes do not overlap boundaries of said exclusion regions.

10. The method of claim 9, wherein said metal fill shapes are either placed completely within said exclusion region or placed completely outside of said exclusion regions.

11. The method of claim 1, further including:
adding dielectric fill shapes to one or more of said wire shapes.

12. The method of claim 11, wherein said dielectric fill shapes are placed completely within said wire shapes.

13. The method of claim 1, further including:

fabricating a first photomask using said first photomask data set and fabricating a second photomask from said second photomask data set.

14. The method of claim 13, further including:

forming wires and metal dummy shapes in a dielectric layer of said wiring level of said integrated circuit chip using said first photomask.

15. The method of claim 14, further including:

removing or modifying select metal dummy shapes of said wiring level of said integrated circuit chip using said second photomask.

16. The method of claim 1, further including:

fabricating a first cell of a multi-cell reticle using said first photomask data set and fabricating a second cell of said multi-cell reticle from said second photomask data set.

17. The method of claim 16, further including:

forming wires and metal dummy shapes in a dielectric layer of said wiring level of said integrated circuit chip using said first cell of said multi-cell reticle.

18. The method of claim 17, further including:

removing or modifying select metal dummy shapes of said wiring level of said integrated circuit chip using said second cell of said multi-cell reticle.

\* \* \* \* \*